United States Patent [19]

Ulm

[11] Patent Number: 5,709,134
[45] Date of Patent: Jan. 20, 1998

[54] CONTROL UNIT FOR AN AUTOMATIC TRANSMISSION

[75] Inventor: Michael Ulm, Alteglofsheim, Germany

[73] Assignee: Siemens Aktiengesellschaft, Munich, Germany

[21] Appl. No.: 738,624

[22] Filed: Oct. 29, 1996

[30] Foreign Application Priority Data

Dec. 11, 1990 [DE] Germany ............ 44 15 133.0

[51] Int. Cl.$^6$ ............................ F16H 57/02; H02B 1/26
[52] U.S. Cl. ............................ 74/606 R; 174/52.2
[58] Field of Search ............................ 74/606 R; 174/52.2

[56] References Cited

U.S. PATENT DOCUMENTS 5,361,650  11/1994  Klecker et al. ............ 74/606 R
5,386,337  1/1995   Schoettl ............ 174/52.2 X

FOREIGN PATENT DOCUMENTS 0 541 035   5/1993   European Pat. Off. .
42 32 205   3/1994   Germany .
4272563     9/1992   Japan ............ 74/606 R
WO 94/27067 11/1994  WIPO ............ 74/606 R

*Primary Examiner*—Charles A. Marmor
*Assistant Examiner*—Mary Ann Battista
*Attorney, Agent, or Firm*—Herbert L. Lerner; Laurence A. Greenberg

[57] ABSTRACT

A control unit for an automatic transmission in a motor vehicle includes a housing having an open bottom part with an interior. A carrier is disposed in the housing. Circuit components are disposed on the carrier. Valve coils for electromagnetic hydraulic valves are disposed in the housing and embedded in a flexible compound. A rotational-speed sensor disposed in the interior of the open bottom part is embedded in the flexible compound and thus fixed in its position in the housing. The rotational-speed sensor extends into the vicinity of a gearwheel or of some other rotating component of the transmission and detects or records its rotary motion by induction or the Hall effect.

4 Claims, 1 Drawing Sheet

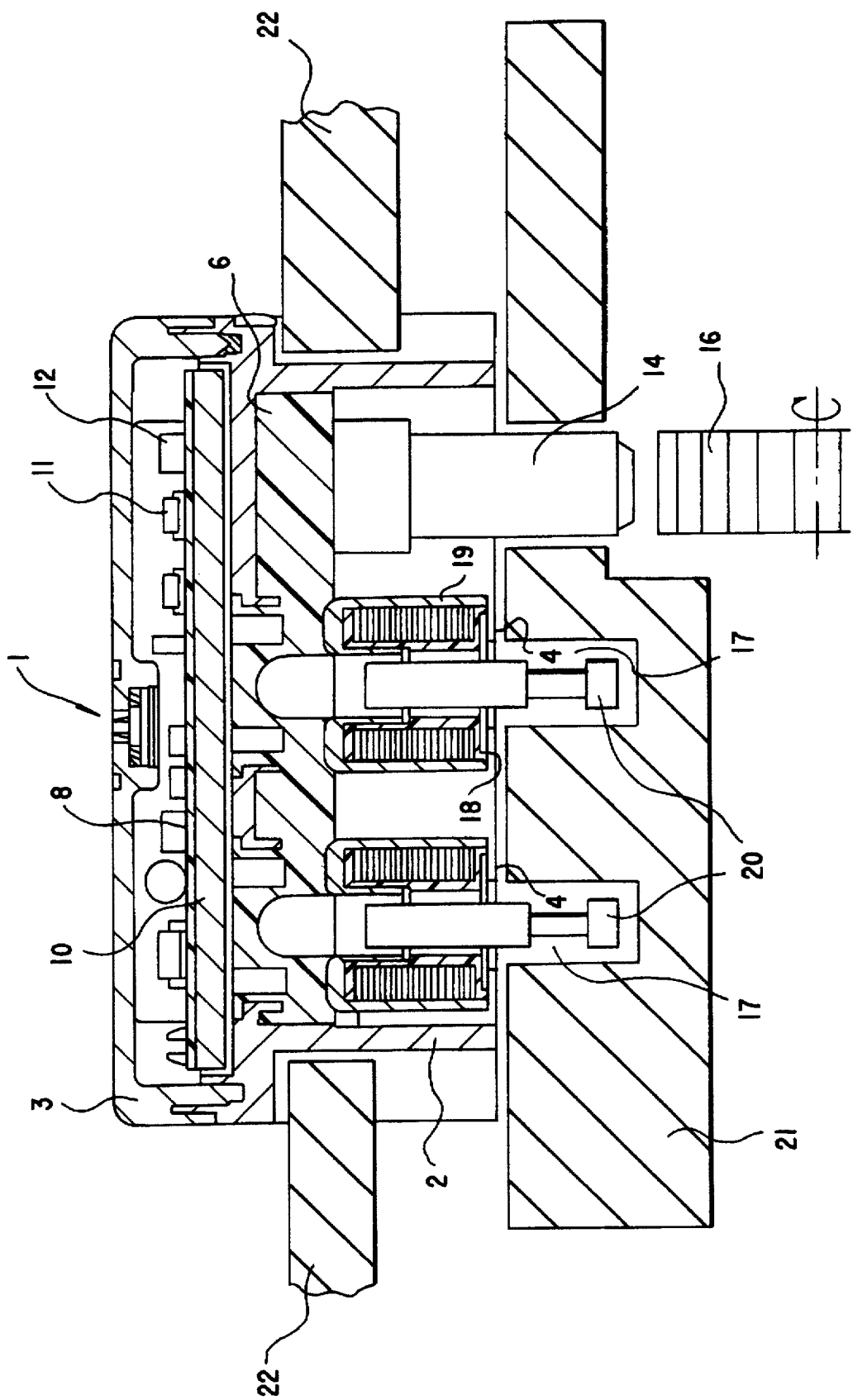

CONTROL UNIT FOR AN AUTOMATIC TRANSMISSION

CROSS-REFERENCE TO RELATED APPLICATION

This application is a Continuation of International Application Serial No. PCT/DE95/00489, filed Apr. 10, 1995.

BACKGROUND OF THE INVENTION

1. Field of the Invention

The invention relates to a control unit for an automatic transmission in a motor vehicle, having a housing which contains a carrier with circuit components, valve coils for electromagnetic hydraulic valves and a flexible compound in which the valve coils are embedded.

Such a control unit is used to control an automatic transmission in a motor vehicle. If the transmission is a step-change transmission, the most suitable gear in each case is chosen and engaged by the control unit depending on the driving condition and the driver's requirements. If the transmission is continuously variable, the control unit determines the most favorable transmission ratio.

In the case of a control unit known from German Published, Non-Prosecuted Patent Application DE 42 32 205 A1, corresponding to U.S. Pat. No. 5,386,337, for controlling electromagnetically actuated hydraulic valves of an automatic transmission, the valve coils are integrated into the control unit by being embedded in a flexible potting compound and are thereby fixed in their position within the housing of the control unit. Through the use of the flexibility of the potting compound, it is possible to compensate for manufacturing tolerances of a valve block onto which the control unit has to be plugged in the process of being mounted on the housing of the automatic transmission.

In order to be able to perform its function satisfactorily, the control unit has to evaluate the signals of a whole series of sensors, e.g. of sensors for the engine speed and the engine load, etc.. In the case of German Published, Non-Prosecuted Patent Application DE 43 34 595 A1, corresponding to U.S. application Ser. No. 08/631,805, filed Apr. 11, 1996, the outlay for connecting cables and plugs that are generally required to connect the transmission control system to the various sensors is reduced by the fact that the sensor signals are transmitted to the transmission control system without the use of wires.

SUMMARY OF THE INVENTION

It is accordingly an object of the invention to provide a control unit for an automatic transmission, which overcomes the hereinafore-mentioned disadvantages of the heretofore-known devices of this general type and which further reduces the outlay required for communication between the control unit and those sensors that record measured variables in the transmission itself.

With the foregoing and other objects in view there is provided, in accordance with the invention, in a motor vehicle having an automatic transmission with a transmission housing, electromagnetic hydraulic valves and a rotating part disposed in the transmission housing, a control unit for the automatic transmission, comprising a housing having an open bottom part with an interior; a carrier disposed in the housing; circuit components disposed on the carrier; valve coils for the electromagnetic hydraulic valves, the valve coils being disposed in the housing; a flexible compound in which the valve coils are embedded; and a rotational-speed sensor disposed in the interior of the open bottom part and embedded in the flexible compound, for detecting or recording rotary motion of the rotating part in the transmission housing.

In accordance with another feature of the invention, the rotational-speed sensor is an inductive sensor or a Hall-effect sensor.

In accordance with a concomitant feature of the invention, the rotational-speed sensor is electrically connected to the circuit components on the carrier.

Other features which are considered as characteristic for the invention are set forth in the appended claims.

Although the invention is illustrated and described herein as embodied in a control unit for an automatic transmission, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The figure of the drawing is a diagrammatic, cross-sectional view of an exemplary embodiment of the invention.

DESCRIPTION OF THE PREFERRED EMBODIMENTS

Referring now in detail to the single figure of the drawing, there is seen a control unit 1 that has a housing which includes a bottom part 2 and a cover 3. The bottom part 2 of the housing contains a row of valve coils 4, which are embedded in a flexible compound 6, e.g. a potting compound, and are thus fixed in their position. In the process of assembly, the bottom part 2, which is open at the bottom, it is inserted into an opening in a transmission housing 22 and fastened to the transmission housing. In the process, the valve coils 4, each of which has an internal cavity 7, are pushed onto what are referred to as valve domes, that project from a valve block built into the transmission and contain hydraulic valves 20 required to actuate friction elements of the transmission. The transmission and the valve block 21 are known per se and are not part of the invention.

The housing of the control unit 1 has a cavity that is closed off by the cover 3 and holds a printed circuit board 8 which serves as a circuit carrier and is fixed (e.g. stuck) to a cooling element 10 in the form, for example, of an aluminum plate. A relatively large number of electrical and electronic components 11, 12 are mounted on the printed circuit board 8, forming a circuit of the control unit, together with non-illustrated conductor tracks which connect them.

A rotational-speed sensor 14 is likewise disposed in the bottom part 2 of the housing and it is embedded in the flexible compound 6 and thereby fixed in its position. The sensor 14 extends into the vicinity of a gearwheel 16 serving as a pole wheel or of some other rotating component, e.g. a break-band drum of the transmission, which effects a change in the magnetic flux and the motion of which it detects by induction or through the use of the Hall effect. Element 16 may be a rotating part in the transmission housing. Non-illustrated electrical connecting wires are routed to contacting holes in the printed circuit board 8 and soldered to them. This eliminates the necessity of taking electrical connecting leads out of the control unit and thereby reduces the outlay for cabling and avoids fault-prone plug-in connections.

The valve coils 4 include, in a known manner, a sleeve-shaped coil former 17 made of plastic, an electrical winding 18 wound onto the latter, and a metallic yoke sleeve 19. They are controlled by the circuit on the printed circuit board 8 and, as mentioned, actuate the hydraulic valves in the transmission.

I claim:

1. In a motor vehicle having an automatic transmission with a transmission housing, electromagnetic hydraulic valves and a rotating part disposed in the transmission housing, a control unit for the automatic transmission, comprising:

a housing having an open bottom part with an interior;

a carrier disposed in said housing;

circuit components disposed on said carrier;

valve coils for the electromagnetic hydraulic valves, said valve coils being disposed in said housing;

a flexible compound in which said valve coils are embedded; and a rotational-speed sensor disposed in said interior of said open bottom part and embedded in said flexible compound, for detecting rotary motion of the rotating part in the transmission housing.

2. The control unit according to claim 1, wherein said rotational-speed sensor is an inductive sensor.

3. The control unit according to claim 1, wherein said rotational-speed sensor is a Hall-effect sensor.

4. The control unit according to claim 1, wherein said rotational-speed sensor is electrically connected to said circuit components on said carrier.

* * * * *

UNITED STATES PATENT AND TRADEMARK OFFICE
CERTIFICATE OF CORRECTION

PATENT NO.  : 5,709,134
DATED       : January 20, 1998
INVENTOR(S) : Michael Ulm It is certified that error appears in the above-identified patent and that said Letters Patent is hereby corrected as shown below:

Title page,
Item [30] should read as follows:

Apr. 29, 1994   [DE]   Germany ........ 44 15 133.0

Title page,
Item [63] should be inserted to read as follows:

Continuation of PCT/DE95/00489, April 10, 1995.

Signed and Sealed this

Nineteenth Day of May, 1998

Attest:

BRUCE LEHMAN

Attesting Officer    Commissioner of Patents and Trademarks